United States Patent [19]

Shibuya

[11] Patent Number: 4,647,808
[45] Date of Patent: Mar. 3, 1987

[54] PIEZOELECTRIC ACTUATOR
[75] Inventor: Tsuyoshi Shibuya, Chofu, Japan
[73] Assignee: Tokyo Juki Industrial Co., Ltd., Chofu, Japan
[21] Appl. No.: 770,665
[22] Filed: Aug. 29, 1985
[51] Int. Cl.⁴ .............................................. H01L 41/08
[52] U.S. Cl. .................................................. 310/328
[58] Field of Search ........................ 310/328, 323, 317

[56] References Cited
U.S. PATENT DOCUMENTS

| | | | |
|---|---|---|---|
| 3,614,486 | 10/1971 | Smiley | 310/317 X |
| 4,435,666 | 3/1984 | Fukui et al. | 310/323 X |
| 4,506,154 | 3/1985 | Scire | 310/328 X |
| 4,518,887 | 5/1985 | Yano | 310/328 |
| 4,547,086 | 10/1985 | Matsumoto et al. | 310/328 X |
| 4,570,095 | 2/1986 | Uchikawa | 310/328 |

Primary Examiner—Mark O. Budd
Attorney, Agent, or Firm—Morgan & Finnegan

[57] ABSTRACT

An actuator comprises a piezoelectric element and a mechanical amplifier. Displacement caused by the piezoelectric effect of the piezoelectric element is amplified mechanically by a lever-link system having a lever portion and a fulcrum. The lever-link system comprises multiple steps. The amplified displacement is effectively provided by a transmitting arm for use in a electronic equipment such as printers.

3 Claims, 13 Drawing Figures

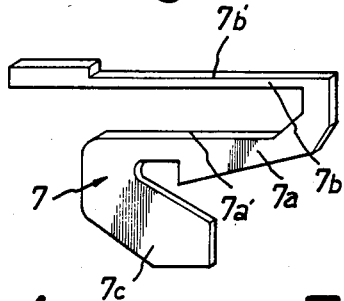
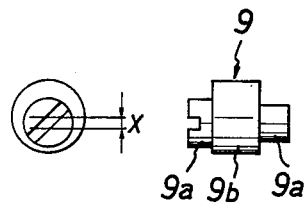
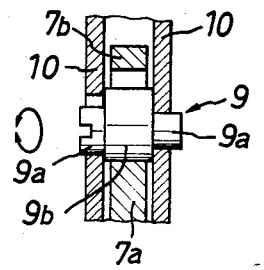
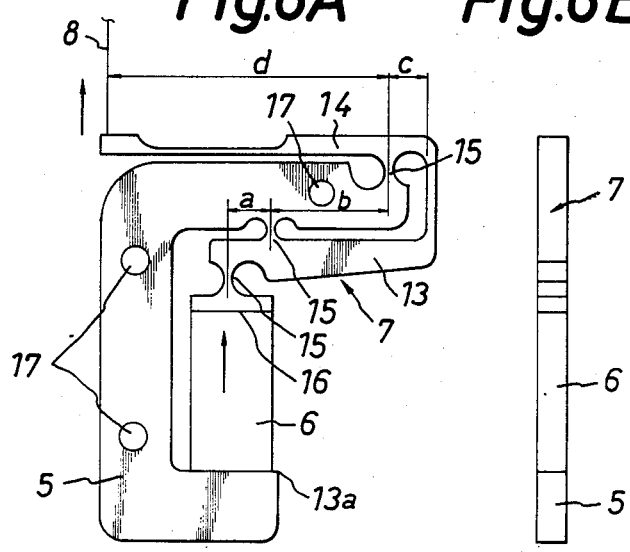
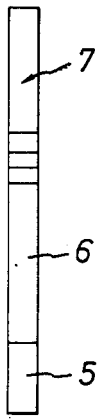

PIEZOELECTRIC ACTUATOR

BACKGROUND OF THE INVENTION

The subject matter of this United States patent application is related to a second United States patent application entitled "Piezoelectric Motor" by T. Shibuya, Ser. No. 770,669, filed currently herewith.

The invention relates to an energy converting device employing the transverse effect of a piezoelectric element. More particularly, the invention relates to an actuator controlled by an electric signal which converts electric energy to linear motion.

Conventionally, stepping motors, electric magnets, and solenoids have been used as a general type of actuator. However, these devices generally cause response time lags due to their electric inductances. For example, in the case of a stepping motor, it cannot stop at a predetermined position accurately due to its inertia. Thus, controlling the stepping motor is complicated. In the case of an electric magnet or a solenoid, due to their lower energy conversion efficiency, power consumption is fairly high. This results in an overheated, shorter life. To overcome these faults, such equipment required larger and heavier construction.

For instance, in the case of a printer using an electric magnet, a movement is attracted by energizing the electric magnet, and electric wires strike an ink ribbon or recording paper against a platen for printing. When deenergized, the movement resumes to its original position by spring action.

Such types of printers cause a fairly heavy movement to go and return in a circular-arc line and their printing speed is thus limited. Besides, such printing causes shock and a noisy metallic sound when the movement strikes. Consequently, such printers sometimes require devices to absorb the sounds and shocks and thus the number of parts for such devices are increased.

It is therefore an object of the invention to eliminate the above described problems associated with known actuators, and to provide a light-weight, noiseless, componentless and firmly constructed actuator.

SUMMARY OF THE INVENTION

These and other objects of the invention are met by providing a piezoelectric actuator comprising a piezoelectric element as the prime mover, a specialized mechanical amplifier for amplifying the displacement of the piezoelectric element, and a displacement transmitting arm for transmitting the amplified displacement. In preferred embodiments, a laminated style of the piezoelectric unit may be provided.

The invention is effective to substantially eliminate prior art faults of inaccurate stopping, unstable workability, low conversion of energy efficiency, overheating troubles, and the bulky or heavy configurations commonly found when stepper motors, electric magnets, or sloenoids are employed as actuators. The invention provides accurate, noiseless displacement. Controlling the prime piezoelectric mover is very easy. Thus, the invention may effectively be utilized as an electronic acuator in a device which requires high speed operation and compact, light-weight construction. For example, the invention may be used in a printing head of a printer for striking pin hammers against paper on a platen through an ink ribbon.

BRIEF DESCRIPTION OF THE DRAWINGS

The invention will be described in greater detail below by way of reference to the following drawings, in which:

FIG. 3 is a perspective view drawing of a mechanical amplifier of the first embodiment of the invention;

FIG. 4 is a front and a side view drawing of a fulcrum shaft of the first embodiment of the invention;

FIG. 5 is a cross sectional view illustrating the relative position between the fulcrum shaft, the fulcrum shaft fixing plate, and the mechanical amplifier of the first embodiment of the invention;

FIG. 6A is a front view drawing of a second embodiment of the invention;

FIG. 6B is a side view drawing of the second embodiment of the invention;

DETAILED DESCRIPTION OF THE DRAWINGS

Referring to the accompanying drawings, three embodiments of the present invention are explained hereinafter.

Figure 1:
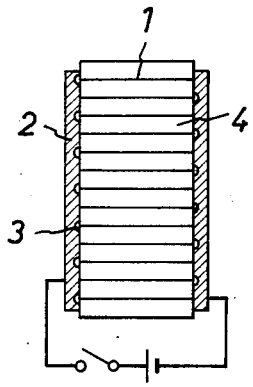
FIG. 1 is an explanatory ilustration of a laminated piezoelectric element.

Referring to FIG. 1, item 1 denotes an internal electrode, item 2 denotes an outer electrode, item 3 denotes an insulator, and item 4 denotes a piezoelectric element.

In general, a displacement per single piezoelectric element of the type illustrated in FIG. 1 is so small that the elements are laminated to increase the total displacement. Voltage is thus applied on an outer electrode 2 to cause the free end of the transverse side to be displaced (expanded). Such types of laminated piezoelectric elements are considered well-known.

Figure 2A:
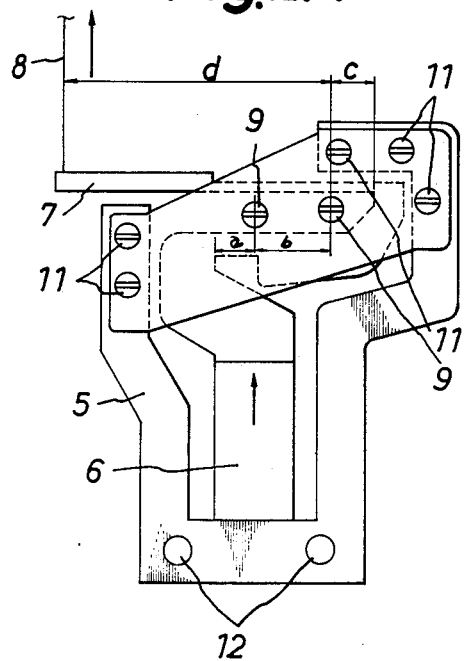
FIG. 2A is a front view drawing of a first embodiment of the invention.
Figure 2B:
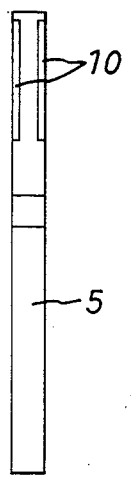
FIG. 2B is a side view drawing of the first embodiment of the invention.

FIG. 2A and FIG. 2B are a front view and a side view, respectively, of a first embodiment of the invention. Item 5 denotes a panel frame made of high tension light alloys like aluminum alloy and provides an opening so that its total configuration is roughly "U" shaped. In this panel frame 5, a piezoelectric element 6 is provided at its bottom, and the bottom side of piezoelectric element may be fixed to the inner surface of the "U" shaped panel frame 5 by applying a bond, for instance, of ARALDITE (tradename).

Item 7 denotes a mechanical amplifier. The details of the amplifier 7 are illustrated in FIG. 3. It may be made of resilient steel (0.8 to 1.0 mm thick) and formed in a roughly "Z" shape. The mechanical amplifier illustrated comprises a first lever portion 7A and a second lever portion 7b. The base end 7c of the mechanical amplifier is fixed to the corresponding end of the piezoelectric element 6, for example, by applying the bond ARALDITE (trademark).

Item 8 (FIG. 2A) is a displacement transmitting arm and is fixed at the tip of the mechanical amplifier 7. Transmitting arm 8 may be made of a hard alloy to resist against frictional force.

Item 9 denotes a fulcrum shaft. Two fulcrum shafts are clamped by a shaft fixing plate 10 which may be made of aluminium and occupies the space between the first lever portion 7a and the second lever portion 7b of the mechanical amplifier 7.

The shaft fixing plate 10 is fastened at the upper end portion of the a "U" shaped frame 5 by fasteners such as screws 11 (refer to FIG. 2A).

FIG. 4 illustrates a fulcrum shaft 9 with a front view and a side view. The fulcrum shaft 9 consists of a shaft portion 9a and a fulcrum portion 9b. The center of these portions are eccentric and may be formed with the shaft in one unit made of light-weight high-strength aluminium alloy.

FIG. 5 illustrates the sectional configuration between the first lever portion 7a and the second lever portion 7b of the mechanical amplifier 7, the fulcrum shaft 9, and the shaft fixing plate 10.

The upper flat surface 7a' (refer to FIG. 3) of the mechanical amplifier 7 slightly contacts the circumferential portion of fulcrum portion 9b. Such an arrangement may be adjusted by turning the slots of shaft portion 9a in the direction of the arrow in FIG. 5. After securing the adjustment of the positioning fulcrum, the shaft portion 9a may be fixed by applying a bond like ARALDITE (tradename). Thus, the position of the fulcrum for the first lever portion 7a is set. Repeating the same procedure, the fulcrum position for the second lever portion 7b may be set.

The operation of an actuator according to the above-described construction of the first embodiment of the invention is explained hereinafter. When voltage is applied on the piezoelectric element 6 (FIG. 2A), since the end of the element is fixed to the "U"-shaped bottom of the panel-frame 5, the generated force acts in the direction of the lower arrow of FIG. 2A, and pushes the base end 7c of the mechanical amplifier 7.

In this case, if the volume of the piezoelectric element 6 is $2 \times 10 \times 20$ mm$^3$, its displacement is 10 $\mu$m ($\mu$m = $10^{-6}$ meter) This displacement is then transmitted to the mechanical amplifier 7 where it is amplified and causes the displacement transmitting arm 8 to displace in the direction of the upper arrow shown in the drawing of FIG. 2A.

In this embodiment, the mechanical amplifier 7 amplifies the displacement by the lever length measured from the fulcrum 9. The displacement by the first lever 7a in this embodiment equals 10 $\mu$m $\times$ b/a. The displacement by the second lever 7b equals 10 $\mu$m $\times$ b/a $\times$ d/c. Accordingly, the total displacement by the mechanical amplifier 7 in this embodiment is equal to 10 mm $\times$ b/a $\times$ d/c.

In the foregoing example of the first embodiment (FIG. 2A) if a=5 mm, b=25 mm, c=5 mm, and d=50 mm, then the resultant magnifying power is 50, and the resultant displacement is 500 $\mu$m.

As aforementioned, the lever length measured from the fulcrum shaft 9 and the two stepping levers are effective to amplify the displacement highly. As a next step, the piezoelectric element 6 may be deenergized. Upon deenergizing the piezoelectric element 6, the displacement at the mechanical amplifier 7 quickly declines and resumes its original position.

Item 12 (FIG. 2A) denotes holes which may be provided for fixing the actuator device when needed.

FIGS. 6A and 6B illustrate a front view and a side view, respectively, of a second embodiment of the invention. The item numbers of FIGS. 6A and 6B correspond to the same items described in the previous embodiment. The second embodiment differs from the first embodiment primarily in that the panel-frame is formed in one unit, and at the mechanical amplifier, several elastic hinges form the fulcrum.

For instance, the panel-frame 5 and the mechanical amplifier 7 in the second embodiment may be made of resilient steel and may be press-formed as one unit. The mechanical amplifier 7 of the second embodiment includes a first lever portion 13, a second lever portion 14, and three fulcrums 15 with three elastic hinges. Piezoelectric element 6 is inserted between the base end 16 of the first lever portion 13 of the mechanical amplifier 7 and the flat internal bottom of the panel-frame 5. The piezoelectric element 6 may be bonded with ARALDITE (tradename) and thus fixed.

The operation of the second embodiment is substantially the same as the first embodiment. According to the second embodiment, if a=5 mm, b=20 mm, c=5 mm, d=40 mm, the displacement at the mechanical amplifier 7 is expressed as follows: displacement = 10 $\mu$m $\times$ b/a $\times$ d/c = 320 $\mu$m. Accordingly, the displacement transmitting arm 8 displaces 320 $\mu$m (magnifying power 32) in the direction of the upper arrow of FIG. 6A.

Item 17 denotes holes for fixing the actuator of FIGS. 6A and 6B when needed.

Figure 7A:
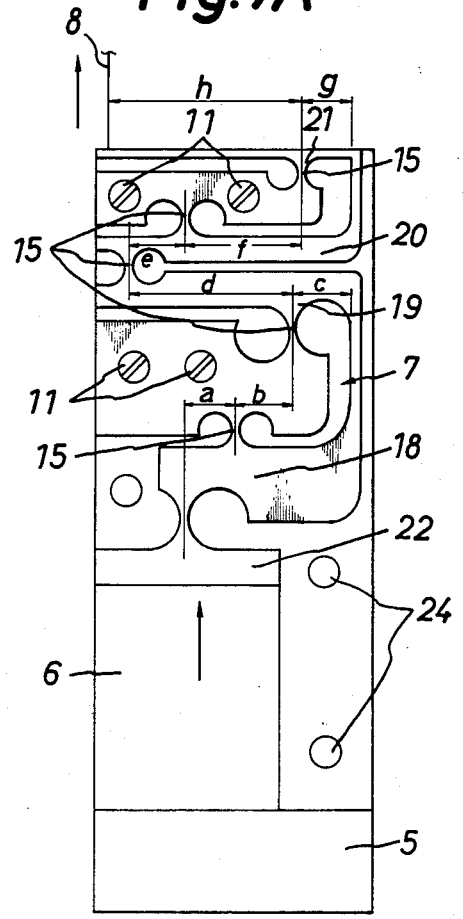
FIG. 7A is a front view drawing of a third embodiment of the invention.
Figure 7B:
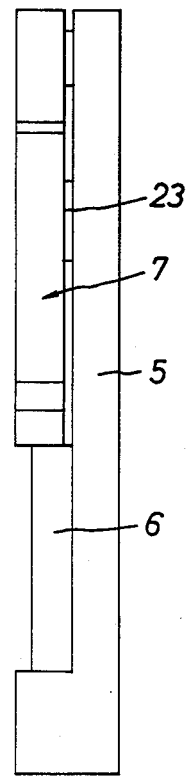
FIG. 7B is a side view drawing of the third embodiment of the invention.

FIGS. 7A and 7B are front and side views, respectively, of a third embodiment of the invention. In this embodiment, the mechanical amplifier and the piezoelectric element 6 are placed on the panel-like frame and thus the embodiment is another form of actuator.

Item 5 in the third embodiment is an L-shaped frame. Item 7 is a mechanical amplifier and includes a first lever portion 18, a second lever portion 19, a third lever portion 20 and a forth lever portion 21. First through fourth lever portions 18-21 are located in a series arrangement. Six fulcrums 15 with elastic hinges are provided. The piezoelectric element 6 is inserted between the base end 22 and the inside flat wall of frame 5 and is bonded with ARALDITE (tradename) and thus fixed.

The mechanical amplifier 7 is fixed by four fasteners such as screws 11 to the flat surface of the frame 5 employing a spacer 23. Item 24 denotes holes for fixing the actuator when needed.

Figure 8:
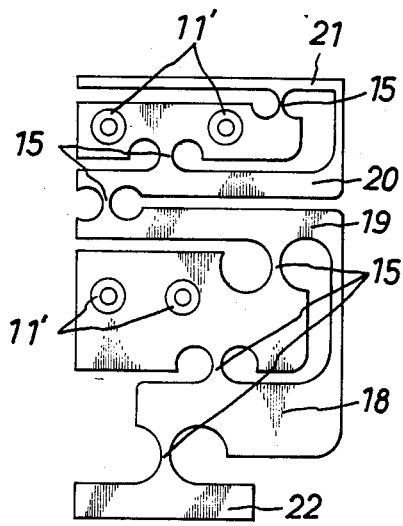
FIG. 8 is a front view drawing of the mechanical amplifier of the third embodiment of the invention.

FIG. 8 illustrates a top view of the mechanical amplifier 7 of the third embodiment. Item 11' denotes holes which receive the flat head portions of fasteners such as screws 11.

Figure 9:
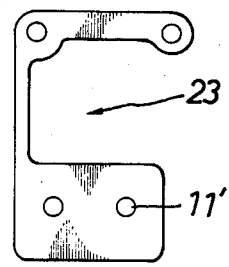
FIG. 9 is a front view drawing of a spacer applied in the third embodiment of the invention.

FIG. 9 shows a spacer 23 which may be provided between the amplifier 7 and the frame 5 as aforementioned. The spacer 23 may be a panel member shaped so as not to interfere with the action of the lever at mechanical amplifier 7, and may provide holes 11' to receive fasteners such as flat head screws.

Figure 10:
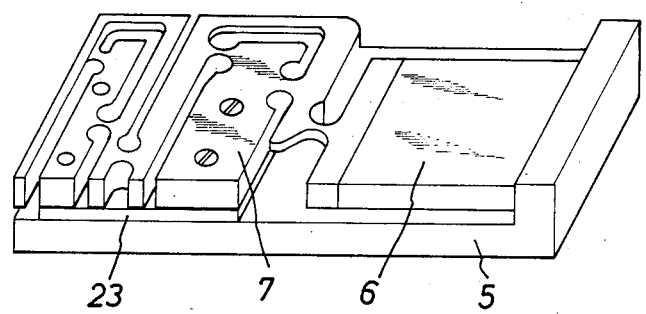
FIG. 10 is a perspective view drawing of the third embodiment of the invention.

FIG. 10 shows a perspective view of the third embodiment of the invention. Operation of the third embodiment is substantially the same as the first embodiment. According to the third embodiment (FIG. 7A), if a=5 mm, b=10 mm, c=4 mm, d=15 mm, e=5 mm, f=10 mm, g=4 mm, and h=18 mm, and the volume of the piezoelectric element is $4 \times 16 \times 20$ mm$^3$, the displacement at mechanical amplifier 7 is expressed as follows: displacement = 20 μm×10/5×15/4×10/5×18/4=1,350 μm and the magnifying power is 67.5. The displacement at the displacement transmitting arm 8 is 1,350 μm and moves in the direction of the upper arrow in FIG. 7A.

The construction and operation of the invention have been described above as comprising a piezoelectric element 6 and a mechanical amplifier 7 arranged such that displacement caused by the piezoelectric element is amplified. Thus, the displacement transmitting arm 8 is effective to be used as an actuator for electronic instruments depending on the service required.

Since an actuator according to the invention may be very thin and compactly constructed, it is possible to combine a plurality of actuators on a base plate by employing spacers in-between so as not to deteriorate the displacement of each actuator. Using the fixing holes 12, 17, 24, with fasteners such as screws, the actuators may be combined. Such combined actuators may be constructed as one unit and may thus be effectively used for a variety of purposes. For example, the printing head of a dot matrix printer is designed to strike many characters within a limited time. The application of an actuator according to the invention within a printing head may be effective to speed up printing and to economize on parts since it is easily replaced as one unit.

When compared with conventional printing heads, printing heads employing actuators according to the invention enable high speed printing, have a very compact light-weight construction and are componentless, easy-assembling, and have many excellent effects from the viewpoint of productivity and economy.

As many apparently widely different embodiments of the invention may be made without departing the spirit and scope therein, it is to be understood that the invention is not limited to the specific embodiments disclosed herein except as defined in the appended claims.

I claim:

1. An actuator, comprising
   a frame;
   displacement transmitting means;
   a mechanical amplifier attached to said displacement transmitting means and including a lever portion;
   a piezoelectric element fixed on one end to said frame and on the other end to said mechanical amplifier;
   a fulcrum shaft including a shaft portion and a fulcrum portion, said shaft portion being eccentric from the center of said fulcrum portion and said fulcrum portion contacting said mechanical amplifier; and
   a pair of shaft fixing plates fixed to said frame and sandwiching said fulcrum shaft therebetween and allowing said fulcrum shaft to eccentrically rotate therein; wherein
   said mechanical amplifier amplifies the displacement of said piezoelectric element and the length of said lever portion measured from said fulcrum shaft at least partially defines the amplifying power of said mechanical amplifier.

2. An actuator as recited in claim 1, wherein said frame and said mechanical amplifier are arranged so as to form one unit.

3. An actuator as recited in claim 1, wherein said piezoelectric element and said mechanical amplifier are situated on a flat surface portion of said frame.

* * * * *